United States Patent [19]

Jensen

[11] Patent Number: 4,594,264

[45] Date of Patent: Jun. 10, 1986

[54] METHOD FOR FORMING GALLIUM ARSENIDE FROM THIN SOLID FILMS OF GALLIUM-ARSENIC COMPLEXES

[75] Inventor: John E. Jensen, Newbury Park, Calif.

[73] Assignee: Hughes Aircraft Company, Los Angeles, Calif.

[21] Appl. No.: 673,467

[22] Filed: Nov. 20, 1984

[51] Int. Cl.$^4$ .............................................. B05D 3/06
[52] U.S. Cl. ................... 427/53.1; 420/555; 420/579; 427/54.1; 427/87
[58] Field of Search ............... 427/54.1, 53.1, 87, 427/86; 420/555, 579

[56] References Cited

U.S. PATENT DOCUMENTS

| | | | |
|---|---|---|---|
| 3,342,551 | 9/1967 | Dotzer | 420/555 |
| 3,394,390 | 7/1968 | Cheney | 420/555 |
| 4,250,202 | 2/1981 | Constant et al. | 427/87 |
| 4,340,617 | 7/1982 | Deutsch et al. | 427/53.1 |
| 4,399,097 | 8/1983 | Gallagher et al. | 420/555 |
| 4,427,714 | 1/1984 | Davey | 427/87 |
| 4,509,997 | 4/1985 | Cockayne et al. | 427/87 |

OTHER PUBLICATIONS

Harrison et al., IBM Tech. Disc. Bull., vol. 4, No. 1, Jun. 1961, p. 32.

Primary Examiner—John H. Newsome
Attorney, Agent, or Firm—A. W. Karambelas

[57] ABSTRACT

A method for depositing GaAs on a substrate is disclosed, involving applying a thin liquid film of a gallium-arsenic complex solution to the substrate and evaporating arsenide complex. The gallium-arsenic complex is selected from the group of complexes having the formula $X_3GaAsR_3$ where X is chlorine, bromine, iodine, phenyl, methyl or trifluoromethyl and R is by hydrogen, phenyl, benzyl, methyl or trifluoromethyl.

The thin solid film is irradiated with ultraviolet light at a sufficient wavelength and of a sufficient intensity to photochemically convert the gallium-arsenic complex to GaAs.

24 Claims, No Drawings

METHOD FOR FORMING GALLIUM ARSENIDE FROM THIN SOLID FILMS OF GALLIUM-ARSENIC COMPLEXES

The Government has rights in this invention pursuant to Contract No. N00014-81-C-0641 awarded by the Department of Navy.

CROSS-REFERENCE TO RELATED APPLICATION

This patent application is related to a co-pending application by the same inventor Ser. No. 673,497, entitled METHOD FOR DEPOSITION OF GALLIUM ARSENIDE FROM VAPOR PHASE GALLIUM-ARSENIC COMPLEXES. The co-pending application discloses a method for depositing GaAs on a substrate involving vapor phase photochemical decomposition of selected gallium arsenide complexes to form GaAs for deposition on the substrate. The gallium arsenide complexes have the formula $X_3GaAsR_3$, where X is methyl or trifluoromethyl and R is hydrogen, methyl or trifluoromethyl. The gallium arsenide complex vapor is irradiated with ultraviolet light at a sufficient wavelength and a sufficient intensity to photochemically convert the vapor to GaAs for deposition.

BACKGROUND OF THE INVENTION

The present invention relates generally to methods for growing high quality crystals of gallium arsenide for use in the fabrication of electronic and opto-electronic devices. More particularly, the present invention relates to methods for growing gallium arsenide crystals by forming thin films of gallium arsenide on a substrate.

There has been an increasing demand for gallium arsenide crystals which are suitable for use in fabricating electronic and opto-electronic devices, as well as solar cells. Accordingly, there has been a great deal of interest in developing simple, effective and reliable techniques for producing high quality gallium arsenide crystals.

Most of the methods presently being used to grow gallium arsenide crystals are either based upon bulk crystal growth or epitaxial techniques. The bulk crystal growth processes are generally based upon the Czochralski or Bridgman methods. Both of these methods basically involve heating a mixture of gallium and arsenic to form a melt of gallium arsenide. A seed crystal is then dipped into the melt. The seed is allowed to melt back a short distance to remove any surface imperfections which may result from its preparation. The seed crystal is then slowly withdrawn from the melt. The rate of seed crystal withdrawal and melt temperature are closely controlled so that a single pure crystal of gallium arsenide is pulled from the melt. This type of bulk crystal growing technique has widely been used for growing various other crystals and the numerous inherent advantages and disadvantages of this technique are well documented.

Both liquid phase and gas phase epitaxy have been used in the past to deposit thin films of pure gallium arsenide on bulk gallium arsenide wafers or substrates. In general, these epitaxial techniques have involved either chemical or thermal treatment of gallium arsenide and gallium arsenide precursors present in the gas or liquid phase to form gallium arsenide which is deposited as a thin ultra-pure crystal on the gallium arsenide substrate. In addition, molecular beam epitaxy has been utilized in growing gallium arsenide crystals. Molecular beam epitaxy basically involves heating gallium metal and arsenic metal to high temperatures in order to form gallium and arsenide atoms. The metal atoms are transmitted to the surface of a bulk gallium arsenide wafer to form thin films of ultra-pure gallium arsenide.

The presently available methods for growing gallium arsenide crystals are well suited for their intended purpose; however, none of the presently available methods have been entirely successful commercially. This lack of commercial success is due in part to various different problems which are inherent in the presently available methods. Accordingly, there is a continuing need to provide methods which are capable of producing commercial quantities of high quality gallium arsenide crystals which are suitable for use in the fabrication of semiconductor devices.

SUMMARY OF THE INVENTION

In accordance with the present invention, a method for growing thin films of gallium arsenide (GaAs) on a suitable substrate is provided which is simple, efficient and amenable to production of commercial quantities of high quality GaAs. The present invention is based on a method of forming thin solid films of gallium-arsenic donor acceptor complexes on a suitable substrate and photochemically converting the thin solid film into gallium arsenide.

The method in accordance with the present invention basically involves applying a thin liquid film of a gallium-arsenic complex solution to a suitable substrate such as a bulk wafer of GaAs. The solution consists essentially of a gallium-arsenic complex which is dissolved in a compatible solvent. The gallium-arsenic complex has the formula $X_3GaAsR_3$, where X is chlorine, bromine, iodine, phenyl, methyl or trifluoromethyl and R is hydrogen, phenyl, benzyl, methyl or trifluoromethyl.

The solvent is then evaporated from the liquid film to form a thin solid film of the gallium-arsenic complex on the substrate. The solid film is then irradiated with ultraviolet light of a sufficient wavelength and a sufficient intensity to photochemically convert the gallium-arsenic complex to gallium arsenide.

The method of the present invention is not temperature critical and can be carried out at room temperature. It is only important that the temperature be below the melting point and/or decomposition temperature of the complex in order to insure formation of a solid film. Further, complicated equipment is not required and film growth is quick and reproducible. The gallium-arsenic complexes exhibit different degrees of sensitivity to moisture and oxygen, so it is necessary to carry out all or part of the method in an inert atmosphere free of oxygen or moisture. However, a vacuum is not required.

The present method is an improvement over prior methods of GaAs crystal growth which, among other things, are relatively slow, require precise temperature controls, utilize complicated and expensive equipment and require processing steps to be carried out in vacuums.

The above discussed and many other features and attendant advantages of the present invention will become apparent as the invention becomes better understood by reference to the following detailed description.

DETAILED DESCRIPTION OF THE INVENTION

The present invention is directed broadly to a method for depositing and growing thin films of GaAs on a wide variety of substrates. Suitable substrates include silicon, germanium, $SiO_2$, $Al_2O_3$, bulk GaAs, ceramics and other conventional substrates which are compatible with GaAs. The present invention has particular application to growing ultra-pure GaAs by epitaxial type growth. Accordingly, a preferred substrate is bulk grade GaAs wafers which are generally employed in epitaxial growth of GaAs in conventional thin film growth processes. In addition, the method is also useful in depositing thin films of GaAs on silicon substrates during the fabrication of microelectronics circuit structures. Silicon is also a preferred substrate.

The first step in the method involves applying a thin liquid film of a gallium-arsenic complex solution to the substrate. In the remainder of this detailed description and in the examples, the substrate will be a <100> silicon wafer, with it being understood that the method has application to any of the above mentioned substrates. The complex solution is prepared by dissolving the gallium-arsenic complex in a suitable hydrocarbon solvent which is free of oxygen, sulfur or nitrogen. Any conventional chlorinated hydrocarbon solvent such as chloroform, methylene chloride or carbon tetrachloride may be used. Aromatic solvents such as benzene and toluene may also be used. Chloroform and toluene are the preferred solvents. The concentration of gallium-arsenic complex in the solvent will vary depending upon the particular complex and the particular solvent. The relative amounts of solvent and complex should be such that enough solvent is used so that the complex is easily dissolved while the solution is not so dilute that a large amount of solution must be evaporated in order to achieve the desired film thickness of solid complex. Typically, the concentration of complex in the solvent will range from about 1 mg/ml to 200 mg/ml, with a range from about 5 mg/ml to 50 mg/ml being preferred.

The gallium-arsenic complexes which are suitable for solid film deposition and photochemical conversion to GaAs have the formula $X_3GaAsR_3$, where X is chlorine, bromine, iodine, phenyl, methyl or trifluoromethyl and R is hydrogen, phenyl, benzyl, methyl or trifluoromethyl. An exemplary gallium-arsenic complex is one where both X and R are methyl. This complex is commercially available from Alpha Ventron, Inc. (Danvers, MA). Other exemplary complexes include those where X is chlorine and R is phenyl; X is chlorine and R is methyl; X is chlorine and R is benzyl; X is iodine and R is phenyl; X is bromine and R is phenyl; X is trifluoromethyl and R is methyl; X is trifluoromethyl and R is hydrogen; and X is phenyl and R is methyl. Exemplary syntheses of these complexes are as follows:

All reactions were carried out under an inert, dry atmosphere (typically less than 1 ppm oxygen content) using purified, dry, oxygen-free solvents.

(1)-Preparation of Trichlorogallium-trimethylarsine complex, $Cl_3GaAs(CH_3)_3$:

In a 100 ml flask, $As(CH_3)_3$ (3.49 grams, 29 mmoles) was added with stirring to a solution of $GaCl_3$ (5.0 grams, 28.4 mmoles) in 50 ml of chloroform. After stirring for about five minutes, a fine white crystalline product of the desired complex deposited from the solution. The white solid was collected on a filter, rinsed with heptane, and vacuum dried. Yield of the product was 93%.

(2)-Preparation of Trichlorogallium-tribenzylarsine complex, $Cl_3GaAs(CH_2C_6H_5)_3$:

This complex was prepared similar to the above complex (1), except that heptane was added to the solution and chloroform was slowly removed at reduced pressure to force the crystallization of the desired product. Yield of the product was 85%.

(3)-Preparation of Trichlorogallium-triphenylarsine complex, $Cl_3GaAs(C_6H_5)_3$:

Preparation of this complex was similar to that of the tribenzylarsine complex (2). Yield of the product was 72%.

(4)-Preparation of Triphenylgallium-trimethylarsine complex, $(C_6H_5)_3GaAs(CH_3)_3$:

In a 50 ml flask, triphenylgallium (1.45 gram, 4.8 mmole) was dissolved in 20 ml of dichloromethane and trimethylarsine (0.67 gram, 5.6 mmoles) was added. The reaction mixture was stirred for 2 hours, then the solvent and unreacted trimethylarsine were removed at reduced pressure until one-half the original volume remained. This caused the precipitation of the complex as a white solid, which was collected on a filter, rinsed with heptane, and vacuum dried. Yield of the product was 65%.

(5)-Preparation of Triiodogallium-triphenylarsine complex, $I_3GaAs(C_6H_5)_3$:

In a 50 ml flask was placed $GaI_3$ (1.0 gram, 2.2 mmoles) and triphenylarsine (0.8 gram, 2.6 mmoles), followed by the addition of 15 ml chloroform. The reaction mixture was stirred overnight. Heptane was added to the mixture and the volume concentrated to half the original volume to precipitate the desired product. Yield of the product was 78%.

(6)-Preparation of Tribromogallium-triphenylarsine complex, $Br_3GaAs(C_6H_5)_3$:

This complex can be prepared similar to the $I_3GaAs(C_6H_5)_3$ complex (5).

(7)-Preparation of Tris(trifluoromethyl)gallium-trimethylarsine complex, $(CF_3)_3GaAs(CH_3)_3$:

This complex can be prepared from $(CF_3)_3Ga$ and $(CH_3)_3As$, in a suitable solvent such as dichloromethane or without solvent on a vacuum line using standard vacuum line techniques. The $(CF_3)_3Ga$ can be synthesized by the method of Lagow (U.S. Pat. No. 3,992,424) for preparing other trifluoromethyl substituted metal compounds.

(8)-Tris(trifluoromethyl)gallium-arsine complex, $(CF_3)_3GaAsH_3$:

This complex can be prepared from $(CF_3)_3Ga$ and $AsH_3$ on a vacuum line using standard vacuum line techniques.

Satisfactory elemental analysis for each of the above prepared complexes were obtained from Galbraith Laboratories, Knoxville TN. These analyses indicate the complexes have Ga/As stoichiometry of 1:1, and are consistent with the formulas predicted for the desired complexes.

The complexes with triphenylarsine and tribenzylarsine (2,3,5,6) appear to be stable as solids in room air and at room temperature. Complexes containing triphenyl- or trimethylgallium, trimethylarsine or arsine are not stable in room air and must be handled entirely in an inert atmosphere. This includes the commercially available complex $(CH_3)_3GaAs(CH_3)_3$, which is not stable in room air, reacts with both oxygen and water vapor, and must be handled in an inert atmosphere at room temperature.

Particularly preferred exemplary complexes are those where X and R contain fluorine. For example, compounds 7 and 8 above are particularly preferred. These complexes are preferred, since minor amounts of carbon may otherwise be introduced into the film during the method due to the breaking of C-H bonds, especially in methyl groups. By using GaAs complexes with trifluoromethyl groups, the possibility of carbon impurities is greatly reduced, since there are fewer C-H bonds in the complex.

The amount of complex solution which is applied to the substrate will depend upon the particular complex being applied, its concentration in the solvent and the desired film thickness. The solution may be applied by any suitable means which provides uniform distribution of the solution on the substrate. Typically, sufficient solution will be applied so that the final GaAs film is on the order of from 1 micrometer to a few micrometers thick. The solution is applied at room temperature and should be in an atmosphere which is preferably free of oxygen and moisture. As mentioned above, the gallium-arsenic complexes are sensitive to heat, oxygen and/or moisture in varying degrees. For some of the more sensitive complexes, it is required that the atmosphere be entirely oxygen- and moisture-free during the entire process. For less sensitive complexes, a certain amount of oxygen and/or moisture may be tolerated in the atmosphere without substantial deleterious effects. Preferably, the atmosphere should be purged with a dry inert gas such as nitrogen, argon or helium.

The second step involves evaporating the solvent to form the thin solid film of gallium-arsenic complex. The evaporation can be conducted at room temperature or slightly elevated temperature so long as the temperature is not so high as to melt or vaporize the complexes or to cause decomposition or breakdown of the complexes. 200° C. is an upper limit for the process, since the complexes all rapidly decompose at temperature above 200° C. A moisture- and oxygen-free atmosphere is also preferred during this step as previously discussed.

The third basic step involves irradiating the solid film with ultraviolet light of a sufficient wavelength and at a sufficient intensity to photochemically convert the solid gallium-arsenic complex film into gallium arsenide. The preferred radiation sources are lasers such as a pulsed krypton fluoride (KrF) excimer laser, which produces pulsed high intensity ultraviolet radiation having a wavelength of 249 nm. Other suitable lasers include a pulsed argon fluoride (ArF) excimer laser (193 nm) or a frequency doubled argon ion laser (257 nm). Other suitable ultraviolet radiation sources may be used so long as they provide wavelengths in the range of 190 nm to 260 nm and are capable of generating radiation which is sufficiently intense to provide the desired photochemical conversion of the gallium arsenide complexes within a reasonable time. The irradiation step must be carried out in an oxygen- and moisture-free atmosphere. As previously mentioned, certain small amounts of oxygen and moisture may be tolerated for some complexes during the initial steps of liquid coating and evaporation. The necessity of an oxygen and moisture-free atmosphere is even more important for the irradiation step than for the previous steps. Again, although small amounts of oxygen and moisture are not fatal to the method, it is preferred that the atmosphere be kept as dry and as oxygen-free as possible.

During the radiation step, the laser or other UV source is directed at the solid gallium-arsenic complex film for a sufficient time to photochemically convert the complex to GaAs. The various decomposition products escape from the solid film to leave a highly pure film of GaAs which is suitable for use in electronic devices.

Examples of practice are as follows:

Thin films (about 1 micrometer thick) of two of the above complexes [(3) and (4)] and triphenylgallium were coated on <100> silicon wafers from solution by evaporating the solvent at room temperature. The samples were then irradiated using the 249 nm line of a krypton/fluoride excimer laser. The samples received 50 pulses, 45 mJ per pulse at 1 Hz, over the 0.5 cm$^2$ sample area in a dry argon atmosphere.

The complex films visibly changed upon irradiation. XPS (X-ray photoelectron spectroscopy, also called ESCA, for Electron Spectroscopy for Chemical Analysis) was used to examine the above films before and after irradiation. The results of ESCA using Mg $K_\alpha$ and Al $K_\alpha$ radiation are listed in Table I. The samples include the gallium-arsenic wafer, as a reference, complexes $Cl_3GaAs(C_6H_5)_3$ (3) and $(C_6H_5)_3GaAs(CH_3)_3$ (4), and triphenylgallium. T,130

The results of the analysis show that the complex $Cl_3GaAs(C_6H_5)_3$ as an unexposed film has a GA:As ratio almost identical to that of the GaAs wafer. After irradiation, the analysis indicates the film has lost both carbon and chlorine. Quantitatively, the film has lost 70% of the carbon and 54% of the chlorine, compared to the unexposed film. Also, importantly, the film has not lost arsenic. The complex $(C_6H_5)_3GaAs(CH_3)_3$ was coated, irradiated and analyzed similarly and gave a much different result. The unexposed film is found to have less arsenic than the exposed film. It has been found from earilier observations that this complex is very sensitive to oxygen and moisture. The reaction with water is given by the following equation:

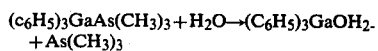

All samples, therefore, are prepared in an oxygen- and moisture-free (<0.5 ppm) atmosphere. We believe that this complex undergoes some decomposition by trace amounts of oxygen or moisture during the testing process. Nevertheless, the exposed sample shows a greater retention of arsenic for this complex. This is interpreted as resulting from the "fixing" of arsenic in the film by the exposure process. This is a result of converting the complex to a more stable chemical form. We have also observed that the unexposed film of this comlex is unstable to the radiation used for the analysis (1486.6 eV aluminum $K_\alpha$ X-rays). During the analysis of the unexposed film, the composition changes and the pressure in the analytical chamber increases slightly (from $2\times10^{-10}$ to $7\times10^{-10}$ torr). The loss of arsenic in the exposed film may be the result of a weaker Ga to As bond in this complex compared to the $Cl_3Ga$ complex (for which there is no loss of As), and thus, some of the As may be lost during the exposure or irradiation process as well as during the testing via ESCA. The above samples, after they were exposed to the 249 nm excimer laser radiation, possessed a nodular surface morphology with 1–20 micrometer sized circular features. Scanning Auger microprobe analysis has shown that the raised nodules are depleted of both chlorine and carbon, but that the interstitial background still contains these elements.

Having thus described exemplary embodiments of the present invention, it should be noted by those skilled in the art that the within disclosures are exemplary only and that various other alternatives, adaptations and modifications may be made within the scope of the present invention. Accordingly, the present invention is not limited to the specific embodiments as illustrated herein, but is only limited by the following claims.

What is claimed is:

1. A method for depositing GaAs on a substrate comprising the steps of:
    applying to said substrate a thin liquid film of a gallium-arsenic complex solution, said solution selected from the group of complexes having the formula $X_3GaAsR_3$ where X is chlorine, bromine, iodine, phenyl, methyl, or trifluoromethyl and R is hydrogen, phenyl, benzyl, methyl or trifluoromethyl, and a compatible solvent in which said complex is dissolved;
    evaporating said solvent from said liquid film to form a thin solid film of said gallium-arsenic complex on said substrate; and
    irradiating said thin solid film in an atmosphere free of oxygen and moisture with ultraviolet light of a sufficient wavelength and a sufficient intensity to photochemical convert said gallium-arsenic complex to gallium arsenide to thereby provide deposition of gallium arsenide on said substrate.
2. The method according to claim 1 where X is chlorine.
3. The method according to claim 2 where R is phenyl.
4. The method according to claim 1 where X is iodine.
5. The method according to claim 1 where X is bromine.
6. The method according to claim 4 where R is phenyl.
7. The method according to claim 1 where X is phenyl.
8. The method according to claim 7 where R is methyl.
9. The method according to claim 1 where X is methyl.
10. The method according to claim 9 where R is methyl.
11. The method according to claim 1 where X is trifluromethyl.
12. The method according to claim 11 where R is trifluoromethyl.
13. The method according to claim 11 where R is methyl.
14. The method according to claim 11 where R is hydrogen.
15. The method according to claim 1 where R is phenyl.
16. The method according to claim 1 where R is benzyl.
17. The method according to claim 1 where R is methyl.
18. The method according to claim 1 where R is trifluoromethyl.
19. The method according to claim 1 wherein said solvent is a hydrocarbon solvent which does not contain nitrogen, oxygen, or sulfur.
20. The method according to claim 17 wherein said solvent is chloroform or toluene.
21. The method according to claim 1 wherein the wavelength of said ultraviolet light is between about 190 to 260 nm.
22. The method according to claim 1 wherein said substrate is Si, Ge, GaAs, $SiO_2$, or $Al_2O_3$.
23. The method according to claim 1 wherein said steps of applying said thin film and evaporating said solvent are conducted in an atmosphere which is free of oxygen and moisture.
24. The method according to claim 1 wherein said ultraviolet light is provided by a laser.

* * * * *